US007455955B2

(12) United States Patent
Shih et al.

(10) Patent No.: US 7,455,955 B2
(45) Date of Patent: *Nov. 25, 2008

(54) PLANARIZATION METHOD FOR MULTI-LAYER LITHOGRAPHY PROCESSING

(75) Inventors: Wu-Sheng Shih, Rolla, MO (US); James E. Lamb, III, Rolla, MO (US); Juliet Ann Minzey Snook, Cook Station, MO (US); Mark G. Daffron, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 138 days.

This patent is subject to a terminal disclaimer.

(21) Appl. No.: 10/373,897

(22) Filed: Feb. 24, 2003

(65) Prior Publication Data

US 2004/0029041 A1 Feb. 12, 2004

Related U.S. Application Data

(60) Provisional application No. 60/360,374, filed on Feb. 27, 2002.

(51) Int. Cl.
*G03F 7/26* (2006.01)
(52) U.S. Cl. .................................. 430/311; 438/760
(58) Field of Classification Search .............. 430/311, 430/322, 271.1; 438/758, 760; 264/494
See application file for complete search history.

(56) References Cited

U.S. PATENT DOCUMENTS

| 4,515,828 | A | | 5/1985 | Economy et al. ............ 427/129 |
|---|---|---|---|---|
| 5,434,107 | A | * | 7/1995 | Paranjpe .................... 438/760 |
| 5,605,867 | A | | 2/1997 | Sato et al. .................. 438/790 |
| 5,650,261 | A | | 7/1997 | Winkle |
| 5,679,610 | A | * | 10/1997 | Matsuda et al. ............. 438/584 |
| 5,736,424 | A | | 4/1998 | Prybyla et al. |
| 5,756,256 | A | | 5/1998 | Nakato et al. |
| 5,935,762 | A | | 8/1999 | Dai et al. |
| 5,967,030 | A | | 10/1999 | Blalock ..................... 100/211 |
| 5,985,524 | A | | 11/1999 | Allen et al. |
| 6,044,851 | A | | 4/2000 | Grieger et al. .............. 134/1.3 |
| 6,048,799 | A | | 4/2000 | Prybyla |
| 6,062,133 | A | * | 5/2000 | Blalock ..................... 100/211 |
| 6,331,488 | B1 | | 12/2001 | Doan et al. ................. 438/698 |
| 6,391,798 | B1 | | 5/2002 | DeFelice et al. ............ 438/780 |
| 6,407,006 | B1 | | 6/2002 | Levert et al. ............... 100/211 |
| 6,544,466 | B1 | * | 4/2003 | Westmoreland ............. 264/494 |
| 6,580,172 | B2 | * | 6/2003 | Mancini et al. ............. 257/762 |
| 6,610,593 | B2 | | 8/2003 | Kohl et al. .................. 438/623 |
| 6,716,767 | B2 | | 4/2004 | Shih et al. ................... 438/760 |
| 6,743,724 | B2 | * | 6/2004 | Doan et al. ................. 438/692 |
| 6,797,607 | B2 | * | 9/2004 | Endisch et al. ............. 438/623 |
| 7,082,876 | B2 | | 8/2006 | Olsson |
| 2002/0093122 | A1 | | 7/2002 | Choi et al. |
| 2004/0029041 | A1 | | 2/2004 | Shih et al. ................. 430/271.1 |
| 2004/0040844 | A1 | | 3/2004 | Chang et al. ............... 156/209 |
| 2006/0249723 | A1 | * | 11/2006 | Doan et al. ................ 257/1 |

FOREIGN PATENT DOCUMENTS

EP 0 388 862 9/1990

OTHER PUBLICATIONS

Introduction to Microlithography, Second edition, edited by Larry F. Thompson, C. Grant Wilson, and Murrae J. Bowden, ACS Professional Reference Book, American Chemical Society, Washington, DC 1994, pp. 232-239, pp. 347-348, and pp. 356-361.
"Dual-Damascene Interconnects" in "Silicon Processing for the VLSI Era, vol. 4: Deep Submicron Process Technology", Stanley Wolf, Lattice Press, Sunset Beach,California, 2002, Ch. 15, pp. 671-710.
César M. Garza, Jeffrey D. Byers, Lewis flanagin, and Maureen Hanratty, "Phtoresist Materials and Processing" in "Handbook of Semiconductor manufacturing Technology", edited by Yoshio Nishi and Robert Doering, Marcel Dekker, Inc., NewYork City, NewYork, 2000, pp. 528-537.
SC Solutions; Chemical Mechanical Planarization (CMP), http://www.scsolutions.com/cmp.htm, 4 pages.
Tech Brief—Chemical Mechanical Planarization (CMP), 2003 IC Knowledge, 1 page.
Colburn, M. et al., "Step and Flash Imprint Lithography: A New Approach to High-Resolution Patterning," Proceedings of the SPIE Conference on Emerging Lithographic Technologies, Santa Clara, California, Mar. 15, 1999, vol. 3676, pp. 379-389.

* cited by examiner

*Primary Examiner*—Kathleen Duda
(74) *Attorney, Agent, or Firm*—Hovey Williams LLP

(57) ABSTRACT

The present invention is directed towards contact planarization methods that can be used to planarize substrate surfaces having a wide range of topographic feature densities for lithography applications. These processes use thermally curable, photo-curable, or thermoplastic materials to provide globally planarized surfaces over topographic substrate surfaces for lithography applications. Additional coating(s) with global planarity and uniform thickness can be obtained on the planarized surfaces. These inventive methods can be utilized with single-layer, bilayer, or multi-layer processing involving bottom anti-reflective coatings, photoresists, hardmasks, and other organic and inorganic polymers in an appropriate coating sequence as required by the particular application. More specifically, this invention produces globally planar surfaces for use in dual damascene and bilayer processes with greatly improved photolithography process latitude. The invention further provides globally planar surfaces to transfer patterns using imprint lithography, nano-imprint lithography, hot-embossing lithography and stamping pattern transfer techniques.

30 Claims, 4 Drawing Sheets

Prior Art

Prior Art

PLANARIZATION METHOD FOR MULTI-LAYER LITHOGRAPHY PROCESSING

RELATED APPLICATIONS

This application claims the priority benefit of a provisional application entitled NOVEL PLANARIZATION METHOD FOR MULTI-LAYER LITHOGRAPHY PROCESSING, Ser. No. 60/360,374, filed Feb. 27, 2002, incorporated by reference herein.

FEDERALLY SPONSORED RESEARCH/DEVELOPMENT PROGRAM

This invention was made with the support of the United States Government under Advanced Technology Program #70NANB1H3019 awarded by the National Institute of Standards and Technology (NIST). The United States Government has certain rights in the invention.

BACKGROUND OF THE INVENTION

1. Field of the Invention

The present invention is broadly directed towards novel contact planarization methods which utilize thermoplastic, thermally curable, and photo-curable planarizing materials for manufacturing microelectronic, photonics, optoelectronic, optical, microelectromechanical system (MEMS), bio-chip, and sensor devices as well as other processes in which lithographic processing is required.

2. Description of the Prior Art

The market demand for microelectronic devices to have smaller physical profiles has driven the need for building smaller microstructures into the devices. In addition, such devices are expected to be more energy efficient and feature more powerful functions while being more cost-effective to build. To achieve these objectives, the feature sizes found on integrated circuit (IC) chips must become increasingly smaller. Therefore, multiple layers of interconnect having smaller microstructures such as lines, trenches, vias, and holes must be patterned onto the device substrates. Currently, photolithography is used to construct these microstructures on the device substrates. This process is normally accomplished with a single photoresist layer. Emerging lithography technologies, such as imprint lithography, nano-imprint lithography, hot embossing lithography, and stamping pattern transfer, have been proposed. These technologies use a patterned mold to transfer patterns onto the substrate surface instead of relying on photolithographic patterning.

To build smaller microstructures, shorter wavelengths of exposure light (e.g., from 248 nm to 193 nm to 157 nm to extreme ultraviolet (EUV) and beyond) have been used in the photolithography process. As a result, the depth of focus (DOF) becomes more narrow, thus leading to a smaller photolithographic processing latitude. Therefore, the substrate surface topography and the thickness and thickness uniformity of the coating(s) applied to the surface to be patterned become critical factors in the fabrication of microstructures having the desired feature sizes. As the wavelength of the exposure light gets shorter, the tolerance of the substrate surface topography becomes more narrow. In addition, the film to be patterned needs to be sufficiently thin to be within the DOF of the photolithography process, assuming that the substrate surface is perfectly planar. As more layers of interconnect are built, the substrate surface topography becomes so severe that it is beyond the limits of what the DOF of the lithography process will allow. Therefore, fine feature sizes cannot be patterned on the substrate surface.

Another challenge posed by surface topography is that a film coating applied over the surface tends to contour to the underlying topography with a non-uniform thickness. That is, the topography of the underlying surface is somewhat reproduced in a slightly less severe manner. The film coating in the recessed areas tends to be thicker than in other areas. The non-uniformity of film thickness, along with the surface topology, create problems by causing under- and overexposed areas and by causing areas that are out of focus (that is, out of the DOF range) in the photolithography process. Therefore, the required critical dimension (CD) control of the microstructures in the photolithographic process cannot be achieved. These factors prohibit achieving the desired feature sizes of the microstructures.

As the DOF narrows, the single-layer photoresist photolithography process has very limited capabilities for meeting patterning requirements due to the topography of the substrate surface and to the thickness and thickness uniformity of the photoresist. Therefore, multi-layer coating processes have been proposed and pursued. A thick layer of planarization material is first coated onto the substrate surface to provide a more planar surface onto which additional coating layers can be applied. The topmost layer undergoes the photolithographic patterning. The patterned structures on the topmost layer are then transferred downward to the substrate, through all the layers applied onto the substrate, with appropriate processes such as anisotropic plasma etching. This technique is referred to as a top-surface imaging process. This top-surface imaging process could involve applying two, three, or even more layers of coatings onto the substrate surface before the photosensitive topmost layer is applied and patterned.

FIGS. 1(a)-(c) depict a prior art process. As shown in FIG. 1(a), as more layers of interconnect are constructed onto the surface of a device substrate 10, the topography 12 produced by the layers becomes unacceptable. Under these circumstances, a single-layer photoresist process is no longer suitable for patterning the desired structures on such a topographic surface. Therefore, a bilayer process has been pursued to improve the lithography process window. This bilayer process involves spin coating a planarization material 14 onto the surface to fill in the recessed areas, such as vias and trenches 16, followed by a thermal reflow process. This planarization material may be an anti-reflective coating, a photoresist, or a similar material. However, the spin-coated layer tends to contour to the surface topology of the underlying layer (see FIG. 1(b)). The thermal gravity reflow process allows coated material to flow into the recessed areas (vias and trenches 16) to somewhat reduce the topography of the surface, as shown in FIG. 1(b). This coated material can be thermally crosslinked during or after the reflow process if necessary. This provides a more planar surface onto which additional layers may be applied. A top layer 18, which is typically a photoresist, is applied on top of the planarization layer as shown in FIG. 1(c). This photoresist layer is patterned during the photolithography process. Therefore, the film thickness, thickness uniformity, and surface topography are critical factors affecting the performance of this top imaging layer. Once the images are patterned into the top layer 18, the substrate surface undergoes a plasma etch process. The images are transferred to the bottom layer, and all the way to the substrate if necessary, by etching the unprotected open areas in the photoresist layer. Because the thickness of the bottom planarization material 14 is not uniform as it coats the topographic substrate surface, and could be thicker than that of the top layer 18, the plasma etch rate of each layer is critical. Preferably the top layer 18 will have a substantially lower plasma etch rate than the bottom layers. The top layer 18 can then act as an etch mask during the pattern transferring process, that is, the plasma etch process. Therefore, the plasma etch selectivities of the bottom and top layers are critical for transferring the patterned imaged from the top layer to the bottom layer and to the underlying substrate.

To ease the etch selectivity requirement and prevent the interaction between the bottom and photoresist layers, it has been proposed that a very thin hardmask layer be applied between the bottom layer and the photoresist layer. This hardmask layer would have the required plasma etch properties and would serve to separate the bottom and photoresist layers. This new process has been referred as a trilayer process. The hardmask layer does not improve the surface planarity of the planarization layer because the hardmask is very thin and conforms to the planarization surface. Therefore, it does not improve the photolithography process latitude so a planarizing bottom layer is still needed for the trilayer process. A specific plasma etch process is needed to transfer the pattern to the hardmask layer, and an additional plasma etch process is used to transfer the pattern further to the bottom planarization layer. In both bilayer and trilayer processes, a planarizing bottom layer is needed to provide a planar surface onto which additional coating layers may be applied.

The dual damascene (DD) process, a widely used technology in advanced IC manufacturing processes, enables the deposition of two metal layers in one metal deposition step. The dielectric layer(s) is etched once or twice (or even more times, depending on the scheme of the DD process) to construct two layers of patterns in the dielectric layer(s). If more than two dielectric layers are involved in a DD process application, the dielectric layers might be separated by a thin hardmask layer that acts as an etch-stop barrier layer. Once the DD patterns are formed, a metal interconnect material is then deposited into the patterns. In one DD process approach, a layer of dielectric material (or photoresist) is spin coated onto the surface of a substrate 20 (FIGS. 2(*a*)-(*c*)). Photolithography is used to create microstructures (vias/trenches 22) having the required aspect ratios with different feature density areas in the layer, as shown in FIG. 2(*a*). The substrate 20 has an area 24 with isolated structures as well as an area 26 with densely located features. Thus, the feature density varies within the die and across the substrate surface. The topography is as profound as it can be when the first planarization layer 28 is coated onto this patterned surface because feature density plays a critical role in determining the final film thickness as shown in FIG. 2(*b*). The film thickness on top of the structure is much thinner in area 26 over densely located features than the film thickness over area 24 containing isolated structures. As a result, local planarization is achieved within an area having the same feature density. However, recessed areas occur as a result of the thinner film thickness over high feature density areas. In the worst cases, if the coated film is not thick enough, the high aspect ratio structures (such as vias and trenches) in the dense feature density areas may be only partially filled while the structures in less dense feature areas may be fully filled by the first planarization material layer 28. Therefore, global planarity is absent within the die and across the substrate surface.

A second layer 30 is then coated onto the planarization layer 28 that lacks global planarity. This second layer can be the photosensitive photoresist layer (for the bilayer process) or a thin hardmask material (for the trilayer process). As shown in FIG. 2(*c*), the second layer 30 tends to contour the topography of the underlying layer 28, with the film layer being thicker over the area 26. One approach to minimize the top layer film thickness non-uniformity and improve the global planarity is to apply a fairly thick (as thick as several microns or even thicker) underlying planarization layer that will provide a better local and global surface planarity onto which additional layer(s) can be applied. The thick planarization layer results in a longer plasma etch time and requires a higher plasma etch selectivity. The plasma etch rate of the planarization layer needs to be much higher than that of the top-imaging layer. These qualities raise the concerns of throughput and materials compatibility with the process. Another approach is to have dummy structures built into the areas having lower feature density to provide less variation of feature density within the die and across the substrate surface to alleviate the feature density effect. Therefore, a better global planarity can be achieved on the planarization layer surface. However, with the use of dummy structures, the designs and circuitry layouts are more complicated. The approach may also increase the die size needed, which is not desirable.

As alternatives to the photolithography process, several emerging lithography technologies, such as imprint lithography, nano-imprint lithography, hot embossing lithography, stamping pattern transfer, etc. have been proposed and pursued in creating microstructures. Imprint lithography, nano-imprint lithography, and hot embossing lithography utilize a mold to imprint the patterns onto a substrate surface onto which a thin, flowable molding material is coated. These processes can be carried out at either ambient temperatures or elevated temperatures. When the mold surface makes contact with the molding material, the material is forced to flow, under the imprint or embossing processing conditions, and to conform to the patterned mold surface. The molded material is then hardened either by a photo or thermal means. The mold is separated from the hardened molded material. Negative patterns of the mold's patterns are transferred to the molded material. The patterned surface is plasma etched with adequate parameters and sequences to transfer the patterns to the underlying layer, if necessary. These lithography technologies do not rely on light exposure through the pattern-bearing photomask (or reticle) to transfer patterns to the photoresist layer. Therefore, DOF is not an issue. However, the coated flowable molding material needs to have a very uniform thickness with a nearly perfect global planarity across the substrate surface. It is reasoned that the mold is rigid and the structures to be transferred are very tiny. The mold surface needs to be kept perfectly parallel to the surface to be patterned. Any topography and thickness non-uniformity in the molding material layer have a high possibility of catastrophic impacts on the final patterns transferred to the substrate surface. A topographic surface will cause incomplete pattern transferring. A non-uniform molding material thickness will cause complexity during plasma etch. That is, thicker film areas will be under-etched while thinner areas will be over-etched. Therefore, a global planar substrate surface is needed onto which a uniform thickness and globally planar surface of a flowable molding material layer can be obtained for the pattern transferring process. A globally planar surface is needed for the stamping process as well when fine structures are stamped onto a device surface.

SUMMARY OF THE INVENTION

The present invention is broadly concerned with novel contact planarization methods and precursor structures formed by those methods which provide globally planar surfaces for photolithographic, imprint, nano-imprint, and hot-embossing lithography as well as stamping pattern transfer processes, thus inhibiting or preventing problems of the prior art.

In more detail, the precursors are formed by first applying (such as by spin-coating, spray coating, casting, puddling, fountain coating, etc.) a planarizing layer to a microelectronic substrate having topography features on its surface. For most applications, this layer (after curing and contact planarization as discussed below) will typically be from about 0.1-10 µm thick, preferably from about 0.1-3 µm, more preferably from about 0.1-1 µm, and even more preferably from about 0.1-0.5 µm. For MEMS applications, the planarization layer thickness will typically be in the range of from about 1-1000 µm, and more preferably from about 1-500 µm.

Examples of typical microelectronic substrates include silicon wafers, compound semiconductor wafers, silicon-on-insulator (SOI) wafers, glass substrates, quartz substrates, organic polymer substrates, composite material substrates, dielectric substrates, metal substrates, alloy substrates, silicon carbide substrates, silicon nitride substrates, sapphire substrates, ceramics substrates, and substrates formed of refractory materials.

The planarizing layer can be an anti-reflective material or photoresist material, or it can be formed from a material comprising an ingredient selected from the group consisting of photo-curable or thermally curable polymers, monomers, oligomers, and mixtures thereof as well as thermoplastic materials. The total weight of monomers, polymers, and/or oligomers in the material should be at least about 1% by weight, preferably from about 5-100% by weight, and more preferably from about 10-80% by weight, based upon the total weight of the planarizing material taken as 100% by weight. Examples of suitable monomers, oligomers, and polymers include monomers, oligomers or polymers of the following: epoxies such as novolac epoxies, acrylates such as novolac epoxy acrylates, vinyl ethers such as novolac epoxy vinyl ethers, polyesters, polyimides, organic and inorganic monomers/oligomers/polymers, and vinyl-containing organic and inorganic monomers/oligomers/polymers, and mixtures of the foregoing.

The material preferably further comprises a solvent which is preferably present at levels of from about 0-99% by weight, preferably from about 0-95% by weight, and more preferably from about 5-85% by weight, based upon the total weight of the material taken as 100% by weight. Suitable solvents include propylene glycol methyl ether (PGME), propylene glycol methyl ether acetate (PGMEA), ethyl lactate, and mixtures of the foregoing. Reactive solvents can also be used which will react with the monomers, oligomers, and polymers during the curing or hardening process. Examples of such solvents include glycidyl ethers, vinyl ethers, allyl ethers, acrylates, and propylene carbonate.

The material preferably further comprises an ingredient selected from the group consisting of acids, acid generators (e.g., thermo-acid generators, photoacid generators), photo-initiators, thermoinitiators, and surfactants. When an acid or acid generator is present, it is preferably present at levels of from about 0.1-10% by weight, and preferably from about 0.55% by weight, based upon the total weight of the material taken as 100% by weight. Examples of suitable acids or acid generators include those selected from the group consisting of triarylsulfonium hexafluorophosphate, triarylsulfonium hexafluoroarsenate, diaryliodonium hexafluorophosphate, diaryliodonium hexafluoroantimonate, diaryliodonium hexafluoroarsenate, triaryl sulphoxonium hexafluorophosphate, aryloxy sulphoxonium hexafluorophosphate, quaternary ammonium triflates, polymeric sulfonic acid esters, dinonylnaphthalene sulfonate esters, and toluenesulfonic acids. The acids or acid generators can also be replaced by bases or base generators.

When a photoinitiator or thermoinitiator is present, they are preferably individually present at levels of from about 0.1-10% by weight, and preferably from about 0.5-5% by weight, based upon the total weight of the material taken as 100% by weight. Examples of suitable photoinitiators or thermoinitiators include those selected from the group consisting of aryl ketones, hydroxy ketones, organic peroxides, organic hydroperoxides, azo compounds, and amine salts of triflic acid.

Regardless of the ingredients included in the planarizing material, during pressing the planarizing material should have a viscosity of from about 10-50,000 cP, and preferably from about 10-5,000 cP. Thus, the material is capable of filling gaps in a size range of from about 0.05 µm and greater, and preferably from about 0.1-50,000 µm.

After the planarizing material is applied, it can be heated to about 50-250° C. for about 5600 seconds to remove residual solvent if necessary. Alternately, the residual solvent can be removed by subjecting the coated object to a vacuum for about 5 to 600 seconds. The material is then contacted with a flat object for sufficient time and pressure to transfer the flat surface of the object to the planarizing layer and to allow the coated material to flow into the recessed areas. The flat object can be formed of quartz, silicon, glass, metal, alloys, ceramics, polymers, etc. The contacting or pressing step will generally comprise applying pressures of from about 1-1,000 psi, more preferably from about 5-250 psi, and even more preferably from about 10-100 psi for a time period of from about 1 second to about 120 minutes, preferably from about 3 seconds to about 10 minutes, and more preferably from about 10 seconds to about 5 minutes.

This process can be carried out in a chamber evacuated to less than about ambient pressure, but ambient conditions, elevated pressures, and an artificial atmosphere are suitable as well. It will be understood that an optical flat or some equivalent means can be used to apply this pressure, and that the chosen pressure-applying means must be selected to adapt to the particular process (e.g., a UV-transparent optical flat is necessary if a UV-curing process is to be utilized). The press process can be conducted in an air atmosphere, an inert atmosphere (containing gases such as nitrogen, argon, etc.), or a specific atmosphere (containing substances such as organic solvent vapors, silicon-containing vapor, water vapor, oxygen, etc.).

The contacting step is typically carried out at temperatures of from about ambient temperatures to about 350° C. For photo-curable planarization materials, the press temperature should be controlled in the range of about ambient temperatures to about 250° C., preferably in the range of about ambient temperatures to about 100° C., and even more preferably in the range of about ambient temperatures to about 50° C. For thermally curable planarization materials, the press temperature should be controlled in the ranges of about ambient temperature to about 350° C., preferably from about 50-250° C., and even more preferably from about 50-200° C.

For thermoplastic planarization materials, the press temperature should be in the range of from about ambient temperatures to about 50° C. above the material's melting point, preferably from about 20° C. below the material's glass transition temperature ($T_g$) to about 20° C. above the material's melting point, and even more preferably from about the material's $T_g$ to about 10° C. above the material's melting point. After the contacting step, the substrate is cooled to below about its $T_g$, and preferably about 20° C. below the $T_g$ or below about 50° C. (whichever is lower), to harden the thermoplastic materials.

While the optical flat object and substrate are maintained in contact (and/or after contact), the planarizing material is hardened or cured by conventional means. For example, if the composition is photo-curable, then it is subjected to UV light (at a wavelength appropriate for the particular composition) so as to cure the layer. Likewise, if the composition is thermally curable, it can be cured by application of heat (e.g., via a hotplate, via an oven, via IR warming, radiant heat, etc.) followed by cooling to less than its $T_g$, and preferably less than about 50° C. or at least about 20° C. below its $T_g$ (whichever is lower). If the composition is thermoplastic, it is allowed to harden or solidify by cooling as discussed above.

Regardless of the material utilized, once the planarization material has hardened or cured, the substrate is separated from the flat object. The planarity of the flat object surface is thus transferred to the substrate surface to provide global planarity. A second coating layer (such as an imaging layer) with uniform film thickness and global planarity can then be applied on the planarized surface. Suitable imaging layers include photoresist layers, imprint layers, and stamped patterns. Furthermore, one or more optional intermediate layers (e.g., mask layers, barrier layers, anti-reflective layers) can be applied prior to the application of the imaging layer. In one embodiment, the intermediate layers are essentially free of metal (i.e., include less than about 0.005% by weight metal, and preferably about 0% by weight metal).

A pattern is then created in the imaging layer according to known processes and transferred to the underlying layers. For example, if the imaging layer is a photoresist, then the layer is selectively exposed to UV light and developed with a conventional photoresist developer to form the pattern. It will be appreciated that this developing step will also selectively remove (depending upon the pattern) any intermediate layers as well as the planarizing layer down to the substrate while leaving at least a portion of the original substrate topography intact. If the imaging layer is an imprint layer then a negative having the desired pattern is pressed against the imprint layer to form the desired pattern therein. The pattern is then etched through the imprint layer, any intermediate layers, and planarizing layer to transfer the pattern. Similarly, if the pattern is a stamped pattern, then the stamped pattern is etched to transfer the pattern through the planarizing layer. The above steps can be repeated to form a second "stack" on the precursor, or the precursor can be subjected to further known processing.

DETAILED DESCRIPTION OF THE PREFERRED EMBODIMENTS

Figure 1:
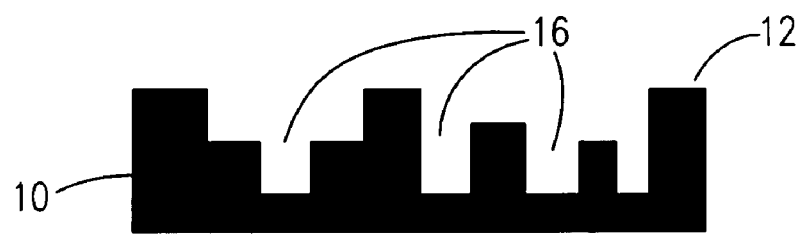
FIGS. 1(a)-(c) depict the steps of a prior art planarization process.
Figure 1:
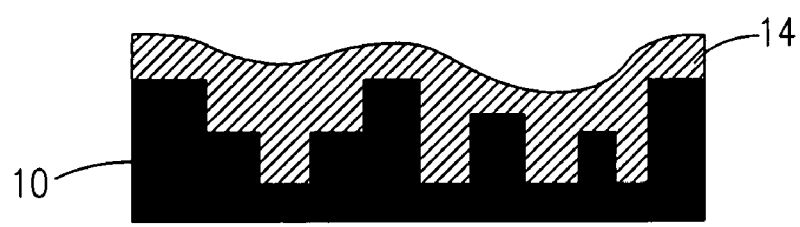
Figure 1:
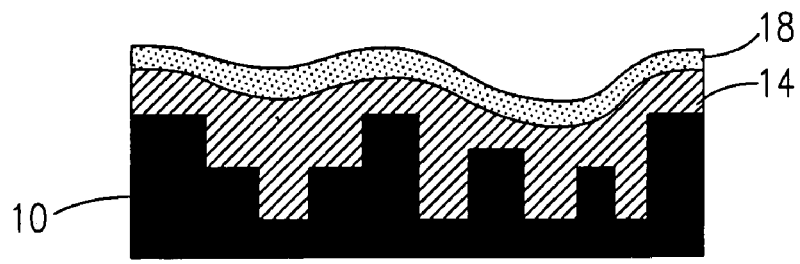
Figure 2:
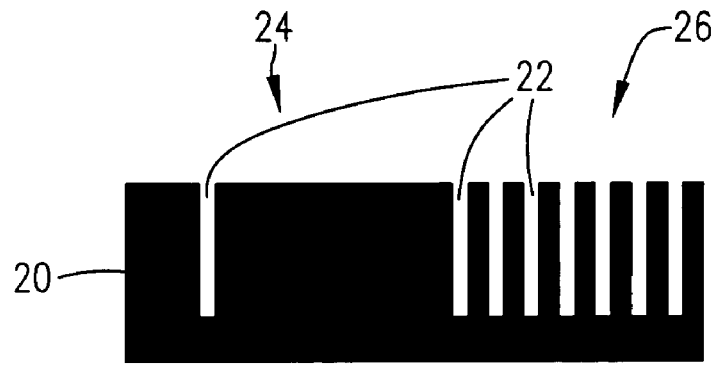
FIGS. 2(a)-(c) depict the steps of another prior art planarization process where the substrate has two different feature density areas.
Figure 2:
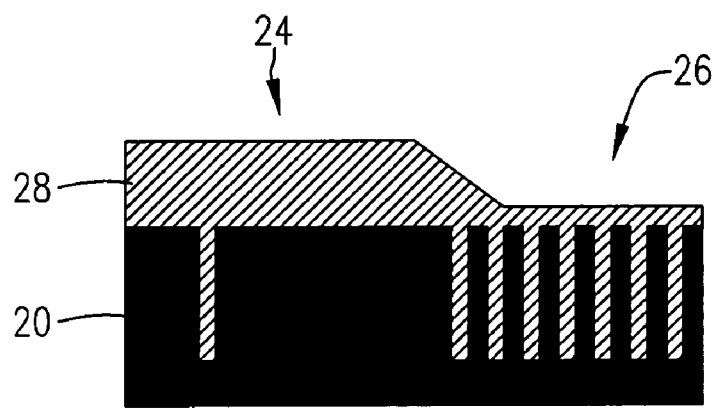
Figure 2:
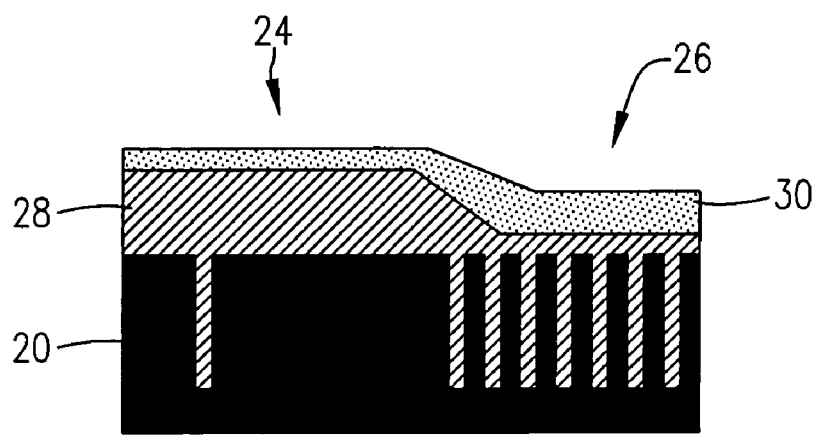
Figure 3:
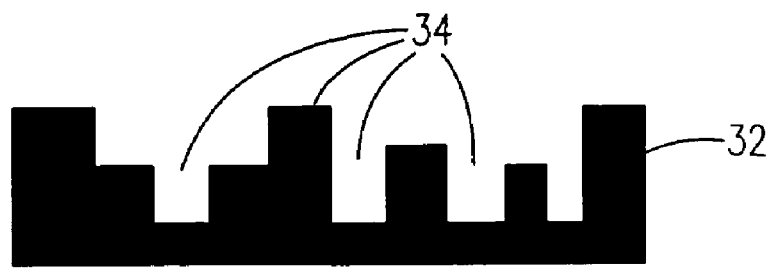
FIGS. 3(a)-(d) depict the steps of a contact planarization process according to the inventive methods.
Figure 3:
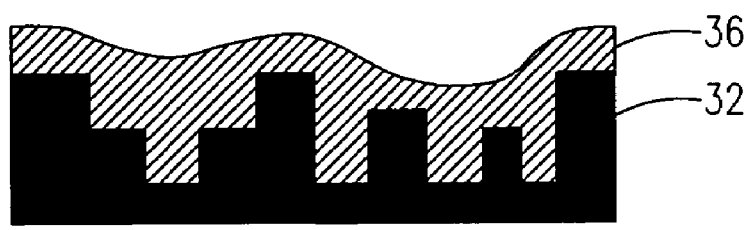
Figure 3:
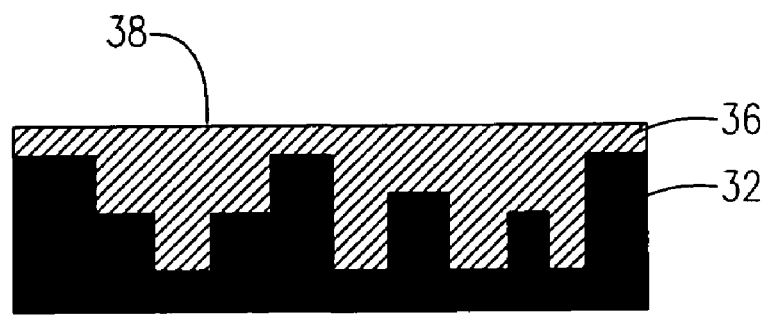
Figure 3:
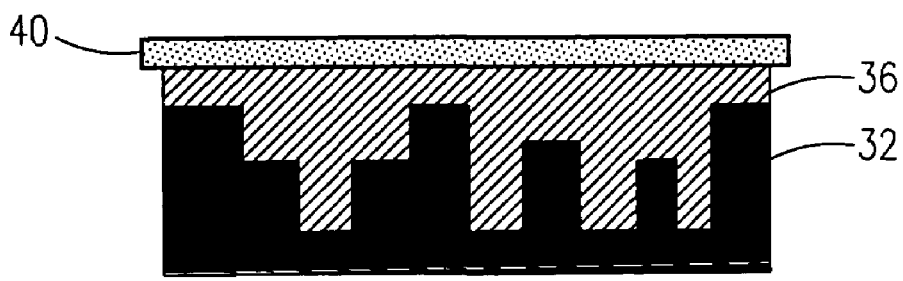

Referring to FIG. 3(a), substrate 32 is shown. Substrate 32 includes a surface having structures or features 34 thereon. These structures or features 34 will have varying topography and feature sizes, depending upon the final intended use of the precursor. As used herein, "topography" refers to the height or depth of a structure while "feature size" refers to the width and length of a structure. If the width and length are different, then it is conventional to reference the smaller number as the feature size.

A planarization material 36 is applied to the substrate 32 using a conventional process (see FIG. 3(b)). A flat surface such as that on an optical flat (not shown) is contacted with material 36 under the process conditions described previously, resulting in a globally planar surface 38 on the material 36 after curing/hardening and separation of the flat surface from the material 36. Thus, the globally planar surface 38 is ready for the application of subsequent layers such as photoresist layer 40 which can be applied in a uniform manner (FIG. 3(d)).

Figure 4:
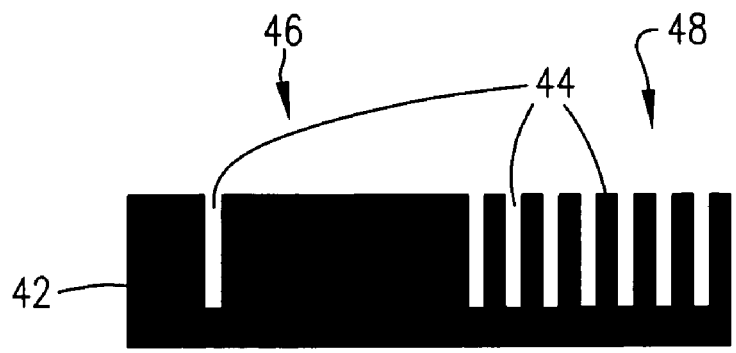
FIGS. 4(a)-(d) depict the steps of a contact planarization process according to the inventive methods where the substrate has two different feature density areas.
Figure 4:
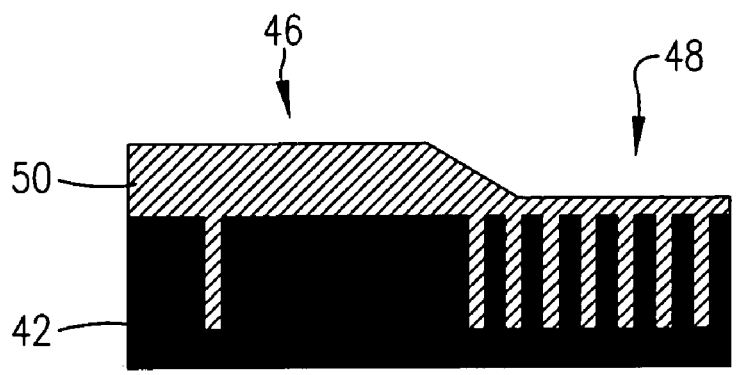
Figure 4:
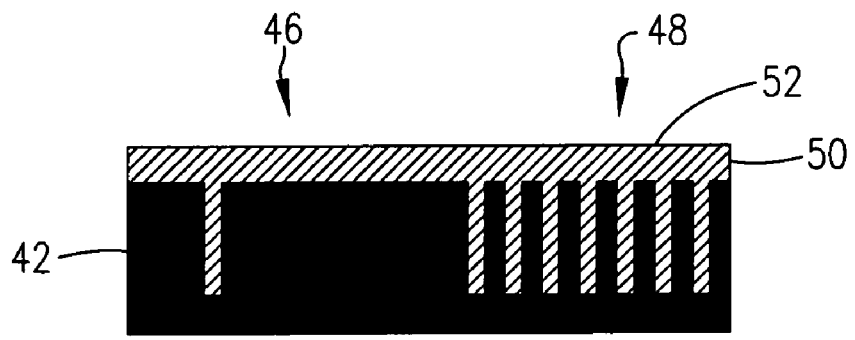
Figure 4:
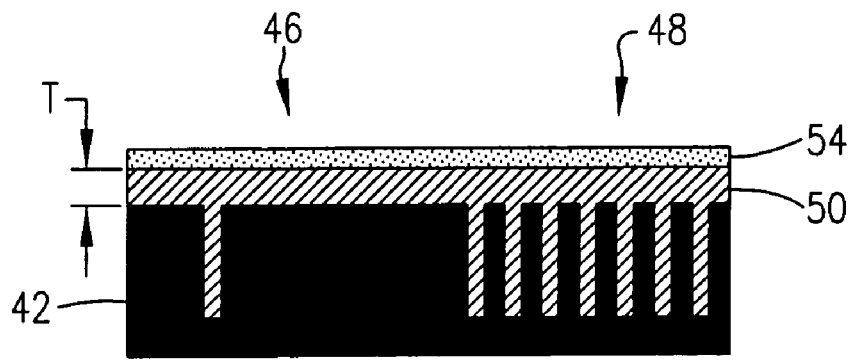

Referring to FIG. 4(a), substrate 42 is shown. Substrate 42 includes a surface having structures or features 44 formed therein. The substrate 42 has an area 46 with isolated structures as well as an area 48 with densely located features. This would have presented problems with prior art methods as discussed previously.

A planarization material 50 is applied to the substrate 42 using a conventional process (see FIG. 4(b)). A flat surface such as that on an optical flat (not shown) is contacted with material 50 under the process conditions described previously, resulting in a globally planar surface 52 on the material 50 after curing/hardening and separation of the flat surface from the material 50 (see FIG. 4(c)). Thus, as shown in FIG. 4(d), the globally planar surface 52 is ready for the application of subsequent layers such as photoresist layer 54 which can be applied in a uniform manner.

As used herein, a globally planar surface is intended to refer to a layer whose thickness "T" (see FIG. 4(d)) varies by less than about 10%, and preferably less than about 5% over a distance of about 10,000 μm. The methods of the present invention result in such global planarity (also referred to as film thickness variation). Furthermore, the cured or hardened planarizing layers formed according to the invention will have a topography over any individual topography feature or structure of less than about 250 Å, and preferably less than about 150 Å. Finally, the inventive cured or hardened planarizing layers will have a topography of less than about 600 Å, preferably less than about 500 Å, and more preferably less than about 400 Å over a distance (substrate surface length) of about 10,000 μm, where at least two different feature density areas are present over this distance.

EXAMPLES

The following examples set forth preferred methods in accordance with the invention. It is to be understood, however, that these examples are provided by way of illustration and nothing therein should be taken as a limitation upon the overall scope of the invention.

Example 1

Photo-Curable Planarization Material on a Via Wafer

A photo-curable material was prepared by mixing of 20 g of epoxy (D.E.R. 354LV, The Dow Chemical Co.), 80 g of PGME (Aldrich), and 1.2 g of Sarcat KI-85 (a photoacid generator available from Sartomer) in a yellow-lighted laboratory. The material was filtered with a 0.2-μm filter and stored in a clean brown bottle.

A via-containing silicon wafer was used as the substrate. The silicon wafer was first coated with a silicon dioxide film having a thickness of about 1 µm. A pattern having areas of various feature densities and having vias that were 0.2 to 1 µm in diameter was formed in the silicon dioxide film. The via depth was about 1 µm.

A film of photo-curable planarization material having a thickness of about 0.4 µm was spin-coated onto the via wafer having various pattern feature density areas. The wafer was transferred to a press tool chamber and placed on a substrate stage. The top surface of the planarization material was oriented to face an optically transparent optical flat object surface. The press tool chamber lid was sealed, and the chamber was evacuated to less than 20 Torr. The chamber pressure was kept at less than 20 Torr for about 30 seconds to remove the residual solvent. The substrate stage was raised to allow the substrate surface to make contact with the optical flat surface with a force of about 68 psi for 30 seconds. While the substrate surface maintained contact with the optical flat surface at a press pressure of 68 psi, a pulsing ultraviolet (UV) light was illuminated through the optical flat surface to cure the planarization material. The pulse cycle of the UV light was 1 second on and 5 seconds off, with a total exposure time of 3 seconds. After the exposure, the press tool chamber was vented from less than 20 Torr (the chamber pressure at which the entire press process was carried out) to air atmosphere. The substrate stage was lowered, and the chamber lid was opened. The substrate was separated from the optical flat surface and removed from the chamber for characterization.

Another via wafer was coated with the same material using identical processing conditions except for the press step. This additional wafer was also prepared and characterized and was used as a reference wafer.

The planarized via wafer surface was characterized with a Tencor Alphastep profilometer. A topography over planarized structures, as well as across the adjacent feature density areas, of less than 200 Å was obtained. The planarization film thickness on top of the structures within different feature density areas was measured using a focused ion beam (FIB) microscope. Two feature density areas were measured. The film thickness on top of the structures in an area having about 0.3-µm diameter vias with a pitch of about 0.5 µm was measured, as well as the film thickness in an area having about 0.3-µm diameter vias with a pitch of about 1.75 µm. The film thicknesses on top of the high structures (not on top of the vias) measured in the two areas were about 0.38 µm and 0.39 µm, respectively. The reference wafer film thicknesses over the areas having the same feature densities as those in the pressed wafer were measured. The reference wafer film thicknesses were about 0.25 µm and 0.44 µm, respectively.

Example 2

Photo-Curable Planarization Material on a Trench Wafer

A photo-curable material was prepared by thoroughly mixing 20 g of epoxy (D.E.R. 354LV, The Dow Chemical Co.), 80 g of PGME (Aldrich), and 1.2 g of Sarcat KI-85 (Sartomer) in a yellow-lighted laboratory. The material was then filtered with a 0.2-µm filter and stored in a clean brown bottle.

A silicon wafer having trench structures that were about 1 µm deep was used as the substrate. The feature density of this wafer ranged from 4% to 96%.

A film of photo-curable planarization material less than 0.5 µm thick was spin-coated onto the silicon trench wafer which included different feature density areas. The wafer was transferred to a press tool chamber and placed on a substrate stage. The coated substrate surface was oriented to face an optically transparent optical flat object surface. The chamber lid was sealed, and the chamber was evacuated to less than 20 Torr. The chamber pressure was maintained at less than 20 Torr for about 30 seconds to remove the residual solvent. The substrate stage was raised to allow the substrate surface to make contact with the optical flat surface with a force of about 68 psi for 300 seconds. While the substrate surface maintained contact with the optical flat surface at a press pressure of 68 psi, a UV light was illuminated through the optical flat surface for 10 seconds to cure the planarization material. After the exposure, the substrate stage was lowered. The press tool chamber was vented from less than 20 Torr (the chamber pressure at which the entire press process was carried out) to air atmosphere. The chamber lid was opened, and the wafer was separated from the optical flat surface and removed from the chamber for characterization.

Another trench wafer was coated with same material using identical processing conditions with the exception of the press step. This wafer was prepared as a reference.

The planarized trench wafer surface was characterized with a Tencor Alphastep profilometer. A surface topography of about 250 Å was measured across the structures, and no more than about a 50 Å topography change was measured across adjacent feature density areas. The reference wafer exhibited a measured surface topography of about 7000 Å across the topographic structures. The planarization film thickness within different feature-density areas of the planarized wafer was measured using a scanning electron microscope (SEM). Film thicknesses over feature-density areas, representing a maximum of about 40% difference in feature density, were measured. Film thicknesses on top of the structures, not over the trenches, in two feature density areas were about 0.45 µm, with a thickness difference of about 0.012 µm (120 Å).

Example 3

Thermo-Curable Planarization Material on a Via Wafer

A thermo-curable material was prepared by mixing 20 g of epoxy (D.E.R. 354LV, The Dow Chemical Co.), 80 g of PGME (Aldrich), and 1.0 g of NACURE Super XC-A230 Catalyst (a thermo-acid generator, available from King Industries) were prepared and mixed thoroughly. The material was filtered with a 0.2-µm filter and stored in a clean brown bottle.

A via-containing silicon wafer was used as the substrate. The silicon wafer was first coated with a silicon dioxide film having a thickness of about 1 µm. A pattern containing vias of 0.2 to 1 µm in diameter and having various feature density areas was patterned into the silicon dioxide film. The depth of the vias was about 1 µm.

A film of thermo-curable planarization material having a thickness of about 0.2 µm was spin-coated onto the silicon via wafer having different feature density areas. The wafer was transferred to a press tool chamber and placed on a substrate stage. The substrate surface that was coated with the planarization material was oriented to face an optically transparent optical flat object surface. The chamber lid was sealed, and the chamber was evacuated to less than about 20 Torr. The chamber pressure was kept at less than 20 Torr for about 60 seconds to remove the residual solvent. The substrate stage was raised to allow the substrate surface to make contact with the optical flat surface with a force of about 68 psi for 60 seconds. While the substrate surface maintained contact with the optical flat surface at a press pressure of 68 psi, a pulsing UV/infrared heating light was illuminated through the optical flat surface to cure the planarization material for 210 seconds at a curing temperature of at least about 130° C. After the curing process, the press tool chamber was vented from less than 20 Torr (the chamber pressure at which the entire press process was carried out) to air atmosphere. The substrate stage was lowered, and the chamber lid was opened. The substrate was separated from the optical flat surface and removed from the chamber for characterization.

The planarized via wafer surface was characterized with a Tencor Alphastep profilometer. The surface topography over planarized structures of less than 100 Å and less than about 300 Å across adjacent feature density areas was measured. The planarization film thickness over structures in different feature-density areas was measured using an SEM. Two feature-density areas were measured. Film thickness on top of the structures in an area having about 0.3-1 μm diameter vias with a pitch of about 0.5 μm was measured. Film thickness was also measured on top of the structures in an area having about 0.3 μm-vias with a pitch of about 1.75 μm. The film thicknesses measured were about 0.19 μm and 0.21 μm, respectively.

We claim:

1. A method of forming a microelectronic precursor, said method comprising the steps of:
   (a) providing a substrate having a surface and including a plurality of topography features on said surface;
   (b) forming a planarizing layer on said surface, said planarizing layer comprising a compound selected from the group consisting of polymers, monomers, oligomers, or mixtures thereof of the following: epoxies, acrylates, vinyl ethers, polyesters, polyimides, and vinyl-containing compounds and mixtures of the foregoing;
   (c) contacting the planarizing layer with a flat surface of an object for sufficient time, pressure, and temperature to transfer the flatness of the flat surface to the planarizing layer, curing or hardening said planarizing layer during or after said contacting, said flattened cured or hardened planarizing layer presenting a globally planar surface ready for the application of subsequent layers;
   (d) optionally forming one or more intermediate layers on said globally planar surface of said planarizing layer;
   (e) forming an imaging layer to yield the microelectronic precursor, said imaging layer being formed on said intermediate layers if present or on said planarizing layer if no intermediate layers are present, said layer-forming steps (d) and (e) being carried out without alteration of said globally planar surface of said planarizing layer;
   (f) creating a pattern on said imaging layer; and
   (g) transferring said pattern to said intermediate layers, if present, and to said planarizing layer, wherein after said transferring step said substrate surface retains at least a portion of its original topography.

2. The method of claim 1, said planarizing layer further comprising an ingredient selected from the group consisting of acids, acid generators, bases, base generators, surfactants, photo-initiators, thermo-initiators, and mixtures thereof.

3. The method of claim 1, wherein said curing or hardening step comprises subjecting said planarizing layer to UV light for sufficient time to substantially cure said composition.

4. The method of claim 1, wherein said curing or hardening step comprises heating said planarizing layer for a sufficient time and temperature to substantially harden said planarizing layer.

5. The method of claim 4, wherein said curing or hardening step comprises cooling said planarizing layer to below about its $T_g$.

6. The method of claim 4, wherein said heating comprises using a radiant heat source to heat said planarizing layer.

7. The method of claim 4, wherein said heating comprises using IR heat to heat said planarizing layer.

8. The method of claim 1, wherein said flattening of step (c) is carried out under ambient pressures.

9. The method of claim 1, wherein said flattening of step (c) is carried out under vacuum.

10. The method of claim 1, wherein said flattening of step (c) is carried out at elevated pressures.

11. The method of claim 1, wherein said flattening of step (c) is carried out under an artificial atmosphere.

12. The method of claim 1, wherein said contacting step is carried out with a pressure application of from about 1-1,000 psi.

13. The method of claim 1, wherein said contacting step is carried out at a temperature of from about ambient temperatures to about 350° C.

14. The method of claim 1, wherein said contacting step is carried out for a time period of from about 1 second to about 120 minutes.

15. The method of claim 1, wherein one or more intermediate layers is present, and each intermediate layer is essentially metal-free.

16. The method of claim 1, wherein:
   said imaging layer comprises a photoresist layer;
   said creating step comprises selectively exposing portions of said photoresist layer to UV light; and
   said transferring step comprises developing said photoresist layer, said intermediate layers, if present, and said planarizing layer.

17. The method of claim 1, wherein:
   said imaging layer comprises an imprint layer;
   said creating step comprises contacting a negative with said imprint layer, said negative having an impression surface which comprises a negative of the pattern; and
   said transferring step comprises etching said pattern through said intermediate layers, if present, and said planarizing layer.

18. The method of claim 1, wherein:
   said imaging layer comprises a stamped pattern; and
   said transferring step comprises etching said pattern through said intermediate layers, if present, and said planarizing layer.

19. The method of claim 1, further including the step of repeating at least some of steps (a)-(g) on said microelectronic precursor.

20. The method of claim 1, wherein at least one intermediate layer is present, said intermediate layer being selected from the group consisting of mask layers, barrier layers, and anti-reflective layers.

21. The method of claim 1, wherein step (c) results in a planarizing layer having a topography over any individual substrate topography feature of less than about 250 Å.

22. The method of claim 1, wherein step (c) results in a planarizing layer having a topography of less than about 600 Å over a substrate surface length of about 10,000 μm where at least two different feature density areas are present over said substrate surface length.

23. The method of claim 1, wherein step (c) results in a planarizing layer having an average thickness a 0.1-10 μm.

24. The method of claim 1, wherein said object comprises an optical flat.

25. A method of forming a microelectronic precursor, said method comprising the steps of:
(a) providing a substrate having a surface and including a plurality of topography features on said surface;
(b) forming a planarizing layer on said surface, said planarizing layer comprising a compound selected from the group consisting of polymers, monomers, oligomers, or mixtures thereof of the following: epoxies, acrylatetcs, vinyl ethers, polyesters, polyimides, and vinyl-containing compounds, and mixtures of the foregoing;
(c) contacting the planarizing layer with a flat surface of an object for sufficient time, pressure, and temperature to transfer the flatness of the flat surface to the planarizing layer, curing or hardening said planarizing layer during or after said contacting, said flattened cured or hardened planarizing layer presenting a globally planar surface ready for the application of subsequent layers;
(d) optionally forming one or more intermediate layers on said globally planar surface of said planarizing layer, said intermediate layers being essentially metal-free; and
(e) forming an imaging layer to yield the microelectronic precursor, said imaging layer being formed on said intermediate layers if present or on said planarizing layer if no intermediate layers are present, said layer-forming steps (d) and (e) being carried out without alteration of said globally planar surface of said planarizing layer.

26. The method of claim 25, wherein step (c) results in a planarizing layer having an average thickness of from about 0.1-10 μm.

27. The method of claim 25, wherein said object comprises an optical flat.

28. A method of forming a microelectronic precursor, said method comprising the steps of:
(a) providing a substrate having a surface and including a plurality of topography features on said surface;
(b) forming a planarizing layer on said surface, said planarizing layer comprising a compound selected from the group consisting of polymers, monomers, oligorners, or mixtures thereof of the following: epoxies, acrylates, vinyl ethers, polyesters, polyimides, and vinyl-containing compounds, and mixtures of the foregoing;
(c) contacting the planarizing layer with a flat surface of an object for sufficient time, pressure, and temperature to transfer the flatness of the flat surface to the planarizing layer, curing or hardening said planarizing layer during or after said contacting, said flattened cured or hardened planarizing layer presenting a globally planar surface ready for the application of subsequent layers;
(d) optionally forming one or more intermediate layers on said globally planar surface of said planarizing layer; and
(e) forming an imaging layer to yield the microelectronic precursor, said imaging layer being formed on said intermediate layers if present or on said planarizing layer if no intermediate layers are present, said layer forming steps (d) and (e) being carried out without alteration of said globally planar surface of said planarizing layer.

29. The method of claim 28, wherein step (c) results in a planarizing layer having an average thickness of from about 0.1-10 μm.

30. The method of claim 28, wherein said object comprises an optical flat.

* * * * *